US011289155B2

(12) United States Patent
Midorikawa et al.

(10) Patent No.: US 11,289,155 B2
(45) Date of Patent: Mar. 29, 2022

(54) SEMICONDUCTOR MEMORY DEVICE WITH WRITE ASSIST CONTROL

(71) Applicants: Kabushiki Kaisha Toshiba, Tokyo (JP); Toshiba Electronic Devices & Storage Corporation, Tokyo (JP)

(72) Inventors: Tsuyoshi Midorikawa, Kanagawa (JP); Toshiaki Dozaka, Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/007,360

(22) Filed: Aug. 31, 2020

(65) Prior Publication Data

US 2021/0280238 A1   Sep. 9, 2021

(30) Foreign Application Priority Data

Mar. 5, 2020 (JP) .............................. JP2020-037955

(51) Int. Cl.
   *G11C 11/419* (2006.01)
(52) U.S. Cl.
   CPC .................................. *G11C 11/419* (2013.01)
(58) Field of Classification Search
   CPC ........................................... G11C 11/417–419
   USPC ....................................................... 365/154
   See application file for complete search history.

(56) References Cited

U.S. PATENT DOCUMENTS

| | | | |
|---|---|---|---|
| 8,400,848 B2 * | 3/2013 | Fujimura | G11C 11/413 365/189.09 |
| 8,773,918 B2 | 7/2014 | Tanabe | |
| 9,171,595 B2 * | 10/2015 | Fujiwara | G11C 7/12 |
| 2004/0232497 A1 * | 11/2004 | Akiyama | H01L 27/1052 257/390 |
| 2012/0206988 A1 * | 8/2012 | Song | G11C 11/419 365/203 |
| 2014/0160871 A1 * | 6/2014 | Zimmer | G11C 7/12 365/189.16 |
| 2018/0374516 A1 * | 12/2018 | Ochiai | G11C 11/413 |
| 2019/0325948 A1 * | 10/2019 | Nautiyal | G11C 11/419 |

FOREIGN PATENT DOCUMENTS

| | | |
|---|---|---|
| JP | 2009-295246 A | 12/2009 |
| JP | 2012-069214 A | 4/2012 |
| JP | 2013-143161 A | 7/2013 |
| JP | 2014-017029 A | 1/2014 |
| WO | 2017-122418 A1 | 7/2017 |

* cited by examiner

*Primary Examiner* — Sung Il Cho
(74) *Attorney, Agent, or Firm* — Allen & Overy LLP

(57) ABSTRACT

According to one embodiment, there is provided a semiconductor memory device including a bit cell, a pair of bit lines and an assist circuit. The pair of bit lines are electrically connected to the bit cell. The assist circuit is configured to be connected to the bit lines and including one or more capacitive elements. A ratio between a parasitic capacitance value of each of the bit lines and a capacitance value of the assist circuit is adjustable.

20 Claims, 10 Drawing Sheets

SEMICONDUCTOR MEMORY DEVICE WITH WRITE ASSIST CONTROL

CROSS-REFERENCE TO RELATED APPLICATIONS

This application is based upon and claims the benefit of priority from Japanese Patent Application No. 2020-037955, filed on Mar. 5, 2020; the entire contents of which are incorporated herein by reference.

FIELD

Embodiments described herein relate generally to a semiconductor memory device.

BACKGROUND

In semiconductor memory devices, such as a static random access memory (SRAM), there is a case where write assist control is performed to assist a data write operation to bit cells. In this case, it is desirable that the write assist control be performed properly.

DETAILED DESCRIPTION

In general, according to one embodiment, there is provided a semiconductor memory device including a bit cell, a pair of bit lines and an assist circuit. The pair of bit lines are electrically connected to the bit cell. The assist circuit is configured to be connected to the bit lines and including one or more capacitive elements. A ratio between a parasitic capacitance value of each of the bit lines and a capacitance value of the assist circuit is adjustable.

Exemplary embodiments of a semiconductor memory device will be explained below in detail with reference to the accompanying drawings. The present invention is not limited to the following embodiments.

First Embodiment

A semiconductor memory device according to a first embodiment is a static random access memory (SRAM), for example, and includes a plurality of bit cells. Each of the plurality of bit cells is continuously supplied with power to retain data, and can be required to operate with lower power consumption and lower voltage. In a case where the voltage of the power supply potential to each bit cell is lowered, data may be destroyed when the data is read from each bit cell, or data may be difficult to write to each bit cell.

Figure 1:
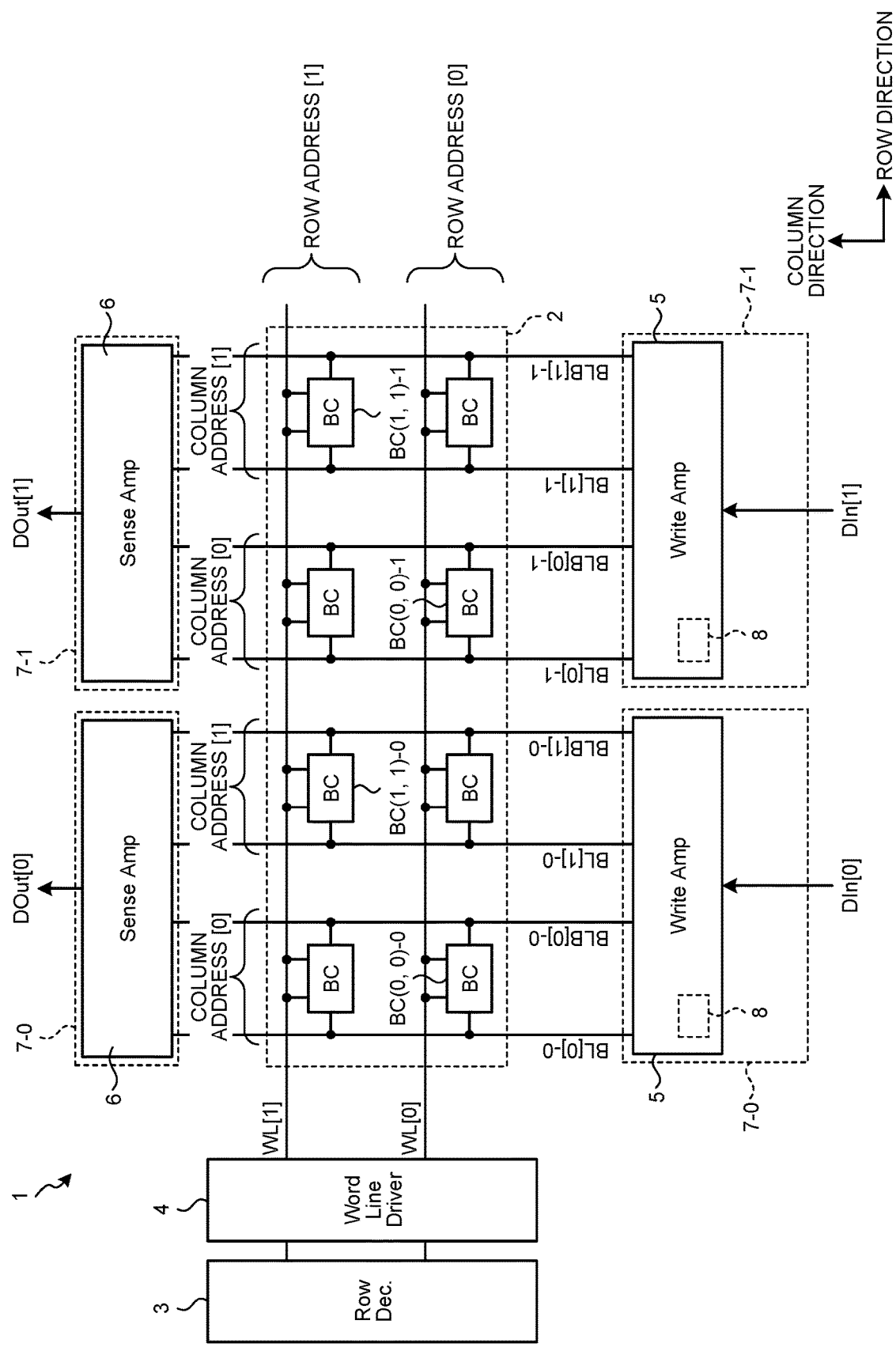
FIG. 1 is a diagram illustrating a configuration of a semiconductor memory device according to a first embodiment.

Specifically, the semiconductor memory device 1 may be configured as illustrated in FIG. 1. FIG. 1 is a diagram illustrating a partial configuration of a bit cell array 2 and a peripheral circuit in the semiconductor memory device 1. The semiconductor memory device 1 includes the bit cell array 2, a plurality of word lines WL[0] and WL[1], a plurality of pairs of bit lines (BL[0], BLB[0]) and (BL[1], BLB[1]), a row decoder 3, a word line driver 4, and a plurality of IO circuits 7-0 and 7-1. Each IO circuit 7 includes a write amplifier (Write Amp.) 5 and a sense amplifier (Sense Amp.) 6. FIG. 1 illustrates a case where the IO circuits 7 are divisionally arranged on both sides in the column direction of the bit cell array 2, and where bit cells BC (0,0)-0 to BC(1,1)-0 and BC(0,0)-1 to BC(1,1)-1 corresponding to 2 rows×4 columns are arrayed for each IO circuit 7.

The row decoder 3 and the word line driver 4 are connected to the plurality of bit cells BC(0,0)-0 to BC(1,1)-0 and BC(0,0)-1 to BC(1,1)-1 through the plurality of word lines WL[0] and WL[1].

The plurality of word lines WL[0] and WL[1] individually extend in the row direction and are arrayed in the column direction. Each word line WL is connected in common to bit cells BC in the same row. The word line WL[0] is connected in common to the bit cells BC(0,0)-0, BC(0,1)-0, BC(0,0)-1, and BC(0, 1)-1. The word line WL[1] is connected in common to the bit cells BC(1, 0)-0, BC(1, 1)-0, BC(1, 0)-1, and BC(1, 1)-1.

The write amplifiers 5 and the sense amplifiers 6 are individually connected to the plurality of bit cells BC(0, 0) to BC(1, 1) through the plurality of pairs of bit lines (BL[0], BLB[0]) and (BL[1], BLB[1]). In a write operation, the write amplifier 5 for each of the IO circuits 7-0 and 7-1 receives data DIn[0] or DIn[1], and writes the data to a bit cell BC selected in accordance with a row address [0:1] and a column address [0]. In a read operation, the sense amplifier 6 for each of the IO circuits 7-0 and 7-1 reads data DOut[0] or DOut[1] from a bit cell BC selected in accordance with a row address [0:1] and a column address [0].

The plurality of pairs of bit lines (BL[0], BLB[0]) and (BL[1], BLB[1]) individually extend in the column direction, and are arrayed in the row direction. Each pair of bit lines BL and BLB are connected in common to bit cells BC in the same column. The pair of bit lines BL[0] and BLB[0] are connected in common to the bit cells BC(1, 0) and BC(0, 0). The pair of bit lines BL[1] and BLB[1] are connected in common to the bit cells BC(1, 1) and BC(0, 1).

Further, the plurality of pairs of bit lines are provided corresponding to the plurality of IO circuits 7. For example, for the IO circuit 7-0, a plurality of pairs of bit lines (BL[0]-0, BLB[0]-0) and (BL[1]-0, BLB[1]-0) are provided.

For the IO circuit 7-1, a plurality of pairs of bit lines (BL[0]-1, BLB[0]-1) and (BL[1]-1, BLB[1]-1) are provided.

Figure 2:
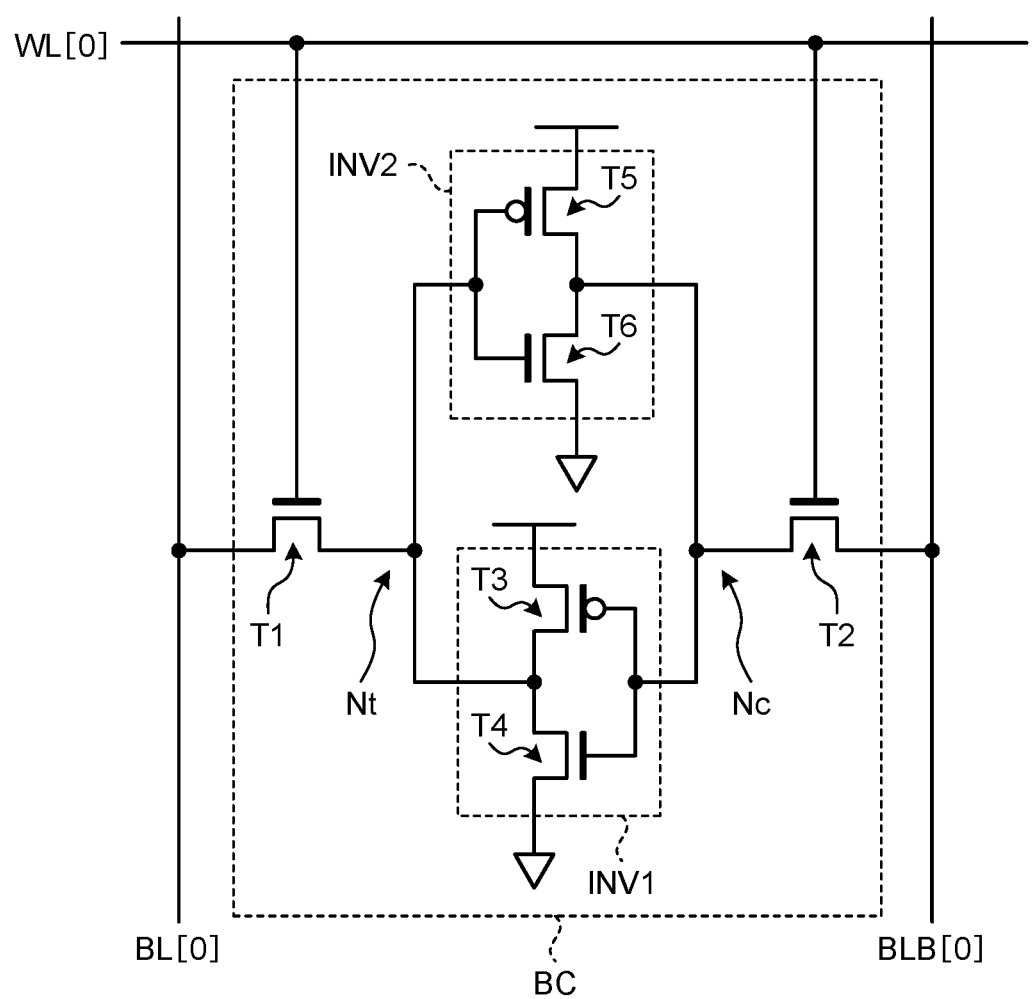
FIG. 2 is a diagram illustrating a configuration of a bit cell in the first embodiment.

Each bit cell BC is configured as illustrated in FIG. 2. FIG. 2 illustrates the configuration of the bit cell BC(0, 0), and the configuration of each of the other bit cells BC(0, 1) to BC(1, 1) is substantially the same as this configuration of the bit cell BC(0, 0).

The bit cell BC(0, 0) is formed of an SRAM cell of the type including six transistors, which are load transistors T3 and T5, drive transistors T4 and T6, and transfer transistors T1 and T2. The load transistor T3 and the drive transistor T4 form an inverter INV1, and the load transistor T5 and the drive transistor T6 form an inverter INV2. The output terminal of the inverter INV1 is connected to the input terminal of the inverter INV2 through an inversion storage node Nc, and the output terminal of the inverter INV2 is connected to the input terminal of the inverter INV1 through a storage node Nt. The inverter INV1 and the inverter INV2 form a flip-flop.

The transfer transistor T1 is connected between the flip-flop storage node Nt and the bit line BL. The transfer transistor T2 is connected between the flip-flop inversion storage node Nc and the inversion bit line BLB. Each of the transfer transistors T1 and T2 is turned on when an active level control signal is supplied from the word line driver 4 to the word line WL. Consequently, the storage node Nt and the inversion storage node Nc are electrically connected to the bit line BL and the inversion bit line BLB, respectively.

For example, in a write operation, when the transfer transistors T1 and T2 are turned on, the data (voltage) supplied from the write amplifier 5 to the bit line BL and the inversion bit line BLB is transferred to the storage nodes Nt and Nc, and a potential level according to the data is written in the storage nodes Nt and Nc.

At this time, as the voltage of the power supply potential to the bit cell BC is lower, the gate voltage of the transfer transistors T1 and T2 becomes lower. Along with this, when the data of the bit cell BC is to be rewritten, the electric charge amounts that can be transferred from the bit line BL and the inversion bit line BLB respectively to the storage node Nt and the inversion storage node Nc may become insufficient for the amounts that logically invert the potentials of the storage nodes Nt and Nc. Accordingly, it may be difficult to write data of different levels to the storage node Nt and the inversion storage node Nc.

On the other hand, the write amplifier 5 illustrated in FIG. 1 performs a write assist operation in the period of a write operation. The write assist operation is an operation for promoting rewriting of the data of the bit cell BC, and includes an operation for improving the drive capability of the transfer transistors T1 and T2.

Figure 3:
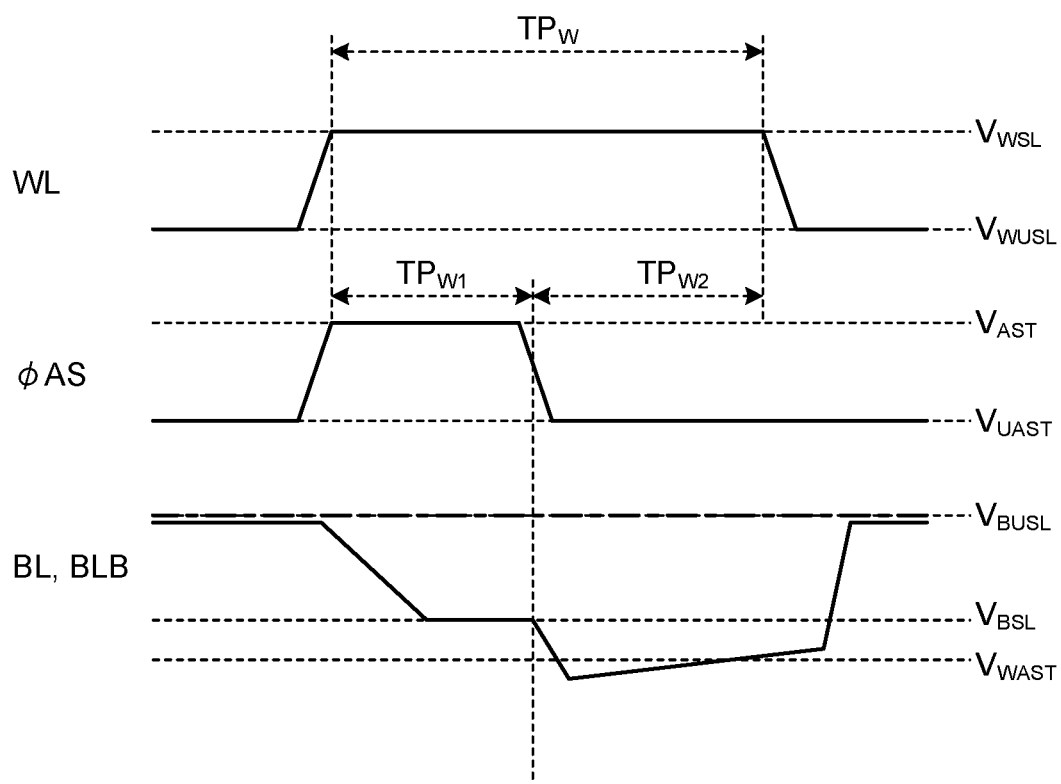
FIG. 3 is a waveform diagram illustrating an operation of the semiconductor memory device according to the first embodiment.

For example, as illustrated in FIG. 3, the row decoder 3 and the word line driver 4 cause a selected word line WL to transition from a non-selected level $V_{WUSL}$ to a selected level $V_{WSL}$ at the start timing of a period $T_{PW}$, and keep the selected word line WL at the selected level $V_{WSL}$ during the period $TP_W$. The period $TP_W$ is the period of a write operation. As illustrated by a one-dot chain line in FIG. 3, the write amplifier 5 keeps one bit line of the pair of bit lines BL and BLB at a non-selected level $V_{BUSL}$ during the period $TP_W$. Further, as illustrated by a solid line in FIG. 3, in the first half period $TP_{W1}$ of the period $TP_W$, the write amplifier 5 causes the other bit line of the pair of bit lines BL and BLB to transition to a selected level $V_{BSL}$ (for example, 0V) and keeps this other bit line at the selected level $V_{BSL}$. In the second half period $TP_{W2}$ of the period $TP_W$, the write amplifier 5 controls this other bit line to be at a write assist level $V_{WAST}$ (for example, −0.2V) lower than the selected level $V_{BSL}$. Consequently, the gate-source voltage of each of the transfer transistors T1 and T2 is increased, and the drive capability of the transfer transistors T1 and T2 is thereby improved. As a result, the transfer of electric charges from the bit line BL and the inversion bit line BLB respectively to the storage node Nt and the inversion storage node Nc is promoted, so that the potentials of the storage node Nt and the inversion storage node Nc can be easily logically inverted. Thus, it becomes easier to write data of different levels to the storage node Nt and the inversion storage node Nc.

If the level width by which the write assist level $V_{WAST}$ is lowered from the selected level $V_{BSL}$ is too small, it may be difficult to compensate for the insufficiency of the drive capability of the transfer transistors T1 and T2. On the other hand, if the level width by which the write assist level $V_{WAST}$ is lowered from the selected level $V_{BSL}$ is too large, it may be caused to perform erroneous writing in a non-selected bit cell BC. Therefore, there is an appropriate range of how much the write assist level $V_{WAST}$ should be lowered from the selected level $V_{BSL}$.

Each write amplifier 5 includes an assist circuit 8. The assist circuit 8 includes assist capacitive elements, and performs a charge sharing operation using a coupling effect of the parasitic capacitance $C_{BL}$ or $C_{BLB}$ of one of the bit lines with the assist capacitive elements in the period $TP_{W2}$ in which the assist operation should be performed. Consequently, the assist circuit 8 lowers the potential of this bit line from the selected level $V_{BSL}$ to the write assist level $V_{WAST}$. Specifically, the assist circuit 8 accumulates electric charges in the assist capacitive elements in the first half period $TP_{W1}$ of the period $TP_W$, and redistributes the electric charges in the second half period $TP_{W2}$ of the period $TP_W$ in accordance with the ratio between the parasitic capacitance value of a bit line BL or BLB and the capacitance value of the assist circuit 8. In this way, the level of the bit line BL or BLB is controlled to be at the write assist level $V_{WAST}$.

For example, in a case where the semiconductor memory device 1 is an SRAM compiler, since the number of rows (the number of word lines) of the bit cell array 2 differs, and the length of the bit lines and the number of cells connected to the bit lines differ, depending on the use application or the like of the semiconductor memory device 1, the values of the parasitic capacitances $C_{BL}$ and $C_{BLB}$ of the bit lines tend to become different. In such cases, when the values of the parasitic capacitances $C_{BL}$ and $C_{BLB}$ of the bit lines deviate from the capacitance values assumed at the time of design of the assist circuit 8, the write assist level $V_{WAST}$ may be shifted from the desired level and come off its appropriate range. For example, in a case where the semiconductor memory device 1 is configured with the minimum number of rows for an SRAM compiler, the bit lines are short and their parasitic capacitance values are small, and thus the write assist level $V_{WAST}$ may end up at a level lower than its appropriate range. Consequently, the semiconductor memory device 1 may perform erroneous operations or the reliability of the device may be deteriorated.

In consideration of the above, this embodiment configures the semiconductor memory device 1 to be adjustable in the ratio between the parasitic capacitance value of each bit line BL or BLB and the capacitance value of the assist circuit 8, so that the write assist level $V_{WAST}$ can be made to fall within its appropriate range.

Specifically, at the time of designing the semiconductor memory device 1, a plurality of assist capacitive elements are included in the assist circuit 8, and the ratio between the parasitic capacitance value of each bit line and the capacitance value of the assist circuit 8 is set to be adjustable by changing the combined capacitance value of assist capacitive elements to be activated among the plurality of assist capacitive elements. The values of the parasitic capacitances $C_{BL}$ and $C_{BLB}$ of the bit lines may vary depending on the number of rows (the number of word lines WL) of the bit cell array 2. In the semiconductor memory device 1, for the ratio between the parasitic capacitance value of each bit line BL or BLB and the capacitance value of the assist circuit 8, the number of rows can be used to estimate a ratio that makes the write assist level $V_{WAST}$ fall within its appropriate range. When manufacturing the semiconductor memory device 1, the combined capacitance value of assist capacitive elements to be activated among the plurality of assist capacitive elements is changed to obtain the ratio estimated at the time of design. Consequently, in the semiconductor memory device 1 thus manufactured, the write assist level $V_{WAST}$ may fall within its appropriate range in a write operation. As a result, it is possible to reduce erroneous operations of the semiconductor memory device 1 and to improve the reliability of the device.

Figure 4:
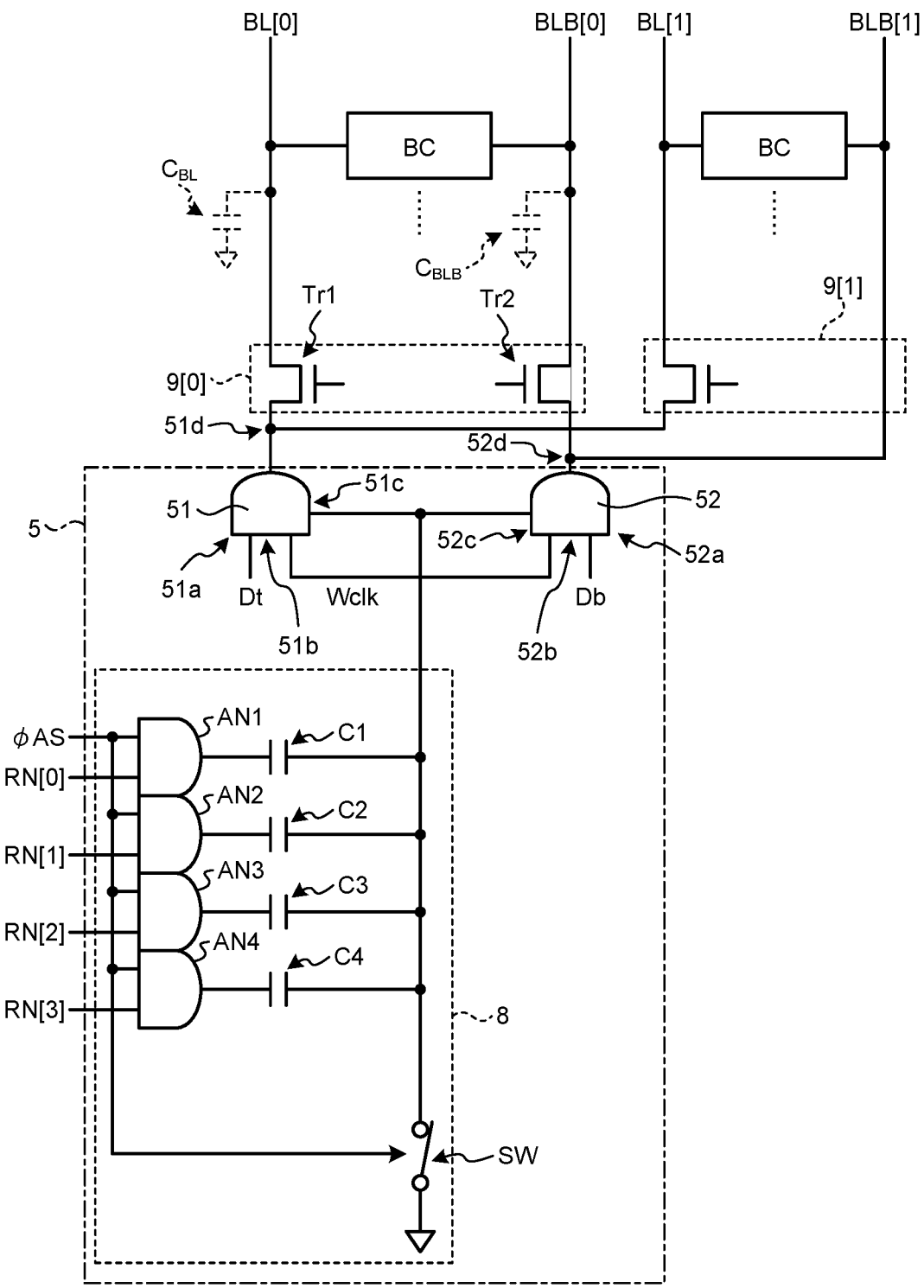
FIG. 4 is a diagram illustrating a schematic configuration of a write amplifier including an assist circuit in the first embodiment.
Figure 5:
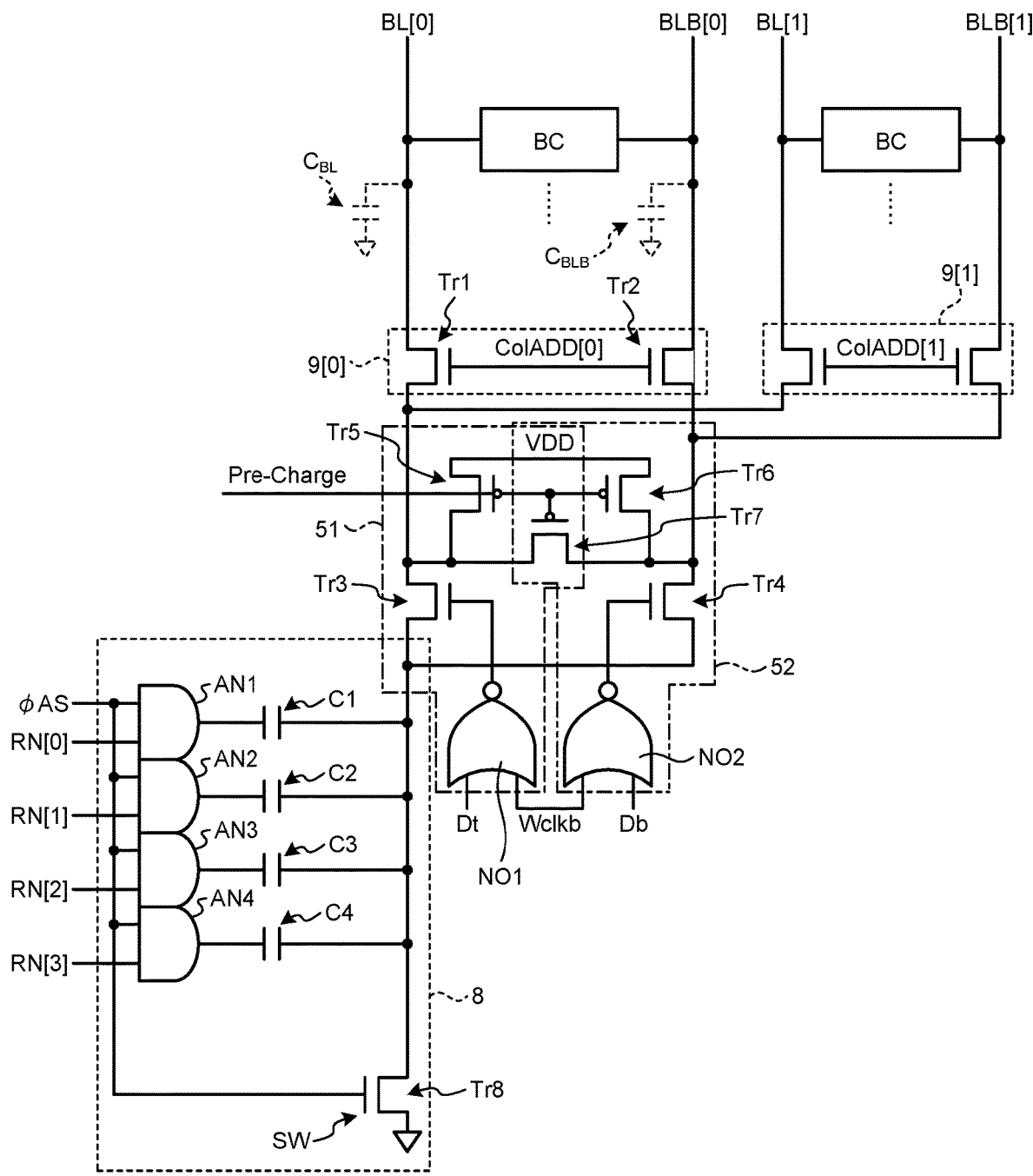
FIG. 5 is a diagram illustrating a detailed configuration of the write amplifier including the assist circuit in the first embodiment.

More specifically, the write amplifier 5 including the assist circuit 8 may be configured as illustrated in FIGS. 4 and 5. FIG. 4 is a diagram illustrating a schematic configuration of the write amplifier 5 including the assist circuit 8. FIG. 5 is a diagram illustrating a detailed configuration of the write amplifier 5 including the assist circuit 8.

The write amplifier 5 may be connected to the bit lines BL and BLB through the column selectors 9[0] and 9[1]. The column selector 9[0] corresponds to the column of a column address [0], and selects the column of the column address [0] to connect the write amplifier 5 to the corresponding bit lines BL and BLB when a signal ColADD[0] becomes an active level. The column selector 9[1] corresponds to the column of a column address [1], and selects the column of the column address [1] to connect the write amplifier 5 to the corresponding bit lines BL and BLB when a signal ColADD[1] becomes the active level. In other words, the write amplifier 5 is shared by the column corresponding to the column selector 9[0] and the column corresponding to the column selector 9[1].

Each column selector 9 includes transistors Tr1 and Tr2 connected to the bit lines BL and BLB. In the respective transistors Tr1 and Tr2, the sources are connected to the bit lines BL and BLB, and the drains are connected to the write amplifier 5. The respective transistors Tr1 and Tr2 in the column selector 9 are turned on when their gates receive the column address signal ColADD at the active level, and connect the write amplifier 5 to the bit lines BL and BLB by assuming that this column has been selected.

In a write operation, the row decoder 3 and the word line driver 4 apply the selected level $V_{WSL}$ to a selected word line WL selected in accordance with a row address. When selected in accordance with a column address, each column selector 9 connects the write amplifier 5 to the corresponding bit lines BL and BLB. Upon reception of data DIn, the write amplifier 5 generates complementary data Dt and Db according to the data DIn, and writes the data Dt and Db to a bit cell BC selected in accordance with the row address and the column address.

The write amplifier 5 includes an amplifier 51, an amplifier 52, and the assist circuit 8. The amplifier 51 receives the data Dt at an input node 51*a*, and receives write clock Wclk at an input node 51*b*. In the amplifier 51, the control node 51*c* is electrically connected to the assist circuit 8, and the output node 51*d* is electrically connected to the column selectors 9.

The amplifier 51 includes a NOR gate NO1 and transistors Tr3, Tr5, and Tr7, as illustrated in FIG. 5.

The NOR gate NO1 receives the data Dt at a first input node, and receives write clock Wclkb at a second input node. In the NOR gate NO1, the output node is electrically connected to the gate of the transistor Tr3.

In the transistor Tr3, the source is connected to the assist circuit 8, and the drain is electrically connected to the bit lines BL through the column selectors 9. The source of the transistor Tr3 corresponds to the control node 51*c* of the amplifier 51. The drain of the transistor Tr3 is electrically connected to the transistors Tr5 and Tr7.

Each of the transistors Tr5 and Tr7 receives a Pre-Charge control signal at the gate. In the transistor Tr5, the source is electrically connected to the bit lines BL through the column selectors 9, and the drain is electrically connected to a power supply potential VDD. In the transistor Tr7, the source is electrically connected to the bit lines BL through the column selectors 9, and the drain is electrically connected to the bit lines BLB through the column selectors 9.

The amplifier 52 illustrated in FIG. 4 receives the data Db at an input node 52*a*, and receives the write clock Wclk at an input node 52*b*. In the amplifier 52, the control node 52*c* is electrically connected to the assist circuit 8, and the output node 52*d* is electrically connected to the column selectors 9.

The amplifier 52 includes a NOR gate NO2 and transistors Tr4, Tr6, and Tr7, as illustrated in FIG. 5.

The NOR gate NO2 receives the data Db at a first input node, and receives the write clock Wclkb at a second input node. In the NOR gate NO2, the output node is electrically connected to the gate of the transistor Tr4.

In the transistor Tr4, the source is connected to the assist circuit 8, and the drain is electrically connected to the bit lines BLB through the column selectors 9. The source of the transistor Tr4 corresponds to the control node 52*c* of the amplifier 52. The drain of the transistor Tr4 is electrically connected to the transistors Tr6 and Tr7.

The transistor Tr6 receives the Pre-Charge control signal at the gate. In the transistor Tr6, the source is electrically connected to the bit lines BLB through the column selectors 9, and the drain is electrically connected to the power supply potential VDD.

Here, the transistor Tr7 is shared by the amplifier 51 and the amplifier 52.

The assist circuit 8 illustrated in FIG. 4 is electrically connected to the control node 51*c* of the amplifier 51 and the control node 52*c* of the amplifier 52. The assist circuit 8 controls, through the amplifier 51 or amplifier 52, the level of the bit line BL or BLB to be at the write assist level $V_{WAST}$ in the period $TP_{W2}$ in which the assist operation should be performed.

The assist circuit 8 includes a plurality of AND gates AN1 to AN4, a plurality of assist capacitive elements C1 to C4, and a switch SW.

The AND gate AN1 receives an assist signal φAS at a first input node, and receives an activation control signal φRN[0] at a second input node. In the AND gate AN1, the output node is electrically connected to one end of the assist capacitive element C1. The other end of the assist capacitive element C1 is electrically connected to one end of the switch SW and the control nodes 51*c* and 52*c* of the amplifiers 51 and 52.

The AND gate AN2 receives the assist signal φAS at a first input node, and receives an activation control signal φRN[1] at a second input node. In the AND gate AN2, the output node is electrically connected to one end of the assist capacitive element C2. The other end of the assist capacitive element C2 is electrically connected to one end of the switch SW and the control nodes 51c and 52c of the amplifiers 51 and 52.

The AND gate AN3 receives the assist signal φAS at a first input node, and receives an activation control signal φRN[2] at a second input node. In the AND gate AN3, the output node is electrically connected to one end of the assist capacitive element C3. The other end of the assist capacitive element C3 is electrically connected to one end of the switch SW and the control nodes 51c and 52c of the amplifiers 51 and 52.

The AND gate AN4 receives the assist signal φAS at a first input node, and receives an activation control signal φRN[3] at a second input node. In the AND gate AN4, the output node is electrically connected to one end of the assist capacitive element C4. The other end of the assist capacitive element C4 is electrically connected to one end of the switch SW and the control nodes 51c and 52c of the amplifiers 51 and 52.

One end of the switch SW is electrically connected to the other ends of the respective assist capacitive elements C1 to C4 and the control nodes 51c and 52c of the amplifiers 51 and 52. In the switch SW, the other end is connected to the ground potential, and receives the assist signal φAS at the control end. The switch SW is turned on when the assist signal φAS is at an active level, and electrically connects the other ends of the respective assist capacitive elements C1 to C4 to the ground potential. The switch SW is turned off when the assist signal φAS is at a non-active level, and electrically cuts off the other ends of the respective assist capacitive elements C1 to C4 from the ground potential.

The switch SW includes a transistor Tr8, as illustrated in FIG. 5. The transistor Tr8 is an NMOS transistor, for example, in which the source is connected to the ground potential and the drain is connected to the other ends of the assist capacitive elements C1 to C4 and the sources of the transistors Tr3 and Tr4. The transistor Tr8 receives the assist signal φAS at the gate.

The semiconductor memory device 1 keeps the assist signal φAS at an active level $V_{AST}$ in the first half period $TP_{W1}$ of the period $TP_W$ of a write operation illustrated in FIG. 3. Consequently, the semiconductor memory device 1 turns on the switch SW, and accumulates electric charges in assist capacitive elements activated in accordance with the activation control signals φRN[0] to φRN[3] among the plurality of assist capacitive elements C1 to C4 in the assist circuit 8. At this time, positive electric charges are accumulated at one ends of the activated assist capacitive elements, and negative electric charges are accumulated at the other ends. The semiconductor memory device 1 keeps the assist signal φAS at a non-active level $V_{UAST}$ in the second half period $TP_{W2}$ of the period $TP_W$ of a write operation. The second half period $TP_{W2}$ is a period during which a write assist operation should be performed. Consequently, the semiconductor memory device 1 keeps the switch SW in a turn-off state, and redistributes the electric charges accumulated in the activated assist capacitive elements in accordance with the ratio between the parasitic capacitance value of a bit line BL or BLB and the capacitance value of the assist circuit 8. At this time, part of the negative electric charges accumulated at the other ends of the activated assist capacitive elements is supplied to the bit line BL or BLB in accordance with the ratio between the parasitic capacitance value of the bit line BL or BLB and the capacitance value of the assist circuit 8. Consequently, the semiconductor memory device 1 controls the levels of the bit line BL or BLB to be at the write assist level $V_{WAST}$, which is lower than the selected level $V_{BSL}$, by using the assist circuit 8.

In order to control the write assist level $V_{WAST}$ to an appropriate level, the semiconductor memory device 1 can be adjusted in the ratio between the parasitic capacitance value of the bit line and the capacitance value of the assist circuit 8 contributive to the assist operation, at the time of manufacturing or the like. The semiconductor memory device 1 may rely on which activation control signal of the plurality of activation control signals RN[0] to RN[3] is set to the active level, to change the combined capacitance value of the assist capacitive elements to be activated among the plurality of assist capacitive elements C1 to C4 in the assist circuit 8. In this way, the semiconductor memory device 1 is set by changing the combined capacitance value of the assist capacitive elements to be activated among the plurality of assist capacitive elements C1 to C4, so as to obtain a ratio estimated at the time of design for the ratio between the parasitic capacitance value of a bit line BL or BLB and the capacitance value of the assist circuit 8.

For example, where C denotes a unit capacitance value, it is assumed that the capacitance values $C_1$, $C_2$, $C_3$, and $C_4$ of the assist capacitive element C1, the assist capacitive element C2, the assist capacitive element C3, and the assist capacitive element C4 satisfy the following formula 1. In this case, the capacitance value of the assist circuit 8 can be changed in four stages in accordance with the number of activation control signals to be set to the active level among the plurality of activation control signals RN[0] to RN[3].

$$C_1=C_2=C_3=C_4=C \qquad \text{formula 1}$$

At this time, a range of Nmin to Nmax for the number of rows able to be arranged is divided into four stages, which are assumed as Nmin to $N_1$, $N_1+1$ to $N_2$, $N_2+1$ to $N_3$, and $N_3+1$ to Nmax.

When the number of rows falls within the range of Nmin to $N_1$, one activation control signal RN[0] is selectively set to the active level. In this case, the assist capacitive element C1 contributes to the assist operation by selection, to redistribute the electric charges in accordance with the ratio between the parasitic capacitance value of a bit line BL or BLB and the capacitance value $C_1$ (=C) of the assist capacitive element C1, in the second half period $TP_{W2}$ of the period $TP_W$ of a write operation. When the number of rows falls within the range of $N_3+1$ to Nmax, four activation control signals RN[0] to RN[3] are set to the active level. In this case, the four assist capacitive elements C1 to C4 contribute to the assist operation, to redistribute the electric charges in accordance with the ratio between the parasitic capacitance value of a bit line BL or BLB and the combined capacitance value ($C_1+C_2+C_3+C_4=4C$) of the four assist capacitive elements C1 to C4, in the second half period $TP_{W2}$ of the period $TP_W$ of a write operation.

Alternatively, where C denotes a unit capacitance value, it is assumed that the capacitance values $C_1$, $C_2$, $C_3$, and $C_4$ of the assist capacitive element C1, the assist capacitive element C2, the assist capacitive element C3, and the assist capacitive element C4 satisfy the following formula 2. In this case, the capacitance value of the assist circuit 8 can be changed in ten stages in accordance with the number of activation control signals to be set to the active level among the plurality of activation control signals RN[0] to RN[3]. The formula 2 shows a case as an example where the capacitance values of the respective assist capacitive elements C1 to C4 are different from each other by a factor of two.

$$C_1=C, C_2=2C, C_3=4C, \text{ and } C_4=8C \qquad \text{formula 2}$$

At this time, a range of Nmin to Nmax for the number of rows able to be arranged is divided into ten stages, which are assumed as Nmin to $N_{11}$, $N_{11}+1$ to $N_{12}$, $N_{12}+1$ to $N_{13}$, $N_{13}+1$ to $N_{14}$, $N_{14}+1$ to $N_{15}$, $N_{15}+1$ to $N_{16}$, $N_{16}+1$ to $N_{17}$, $N_{17}+1$ to $N_{18}$, $N_{18}+1$ to $N_{19}$, and $N_{19}+1$ to Nmax.

When the number of rows falls within the range of Nmin to $N_{11}$, one activation control signal RN[0] is selectively set to the active level. In this case, the assist capacitive element C1 contributes to the assist operation by selection, to redistribute the electric charges in accordance with the ratio between the parasitic capacitance value of a bit line BL or BLB and the capacitance value $C_1$ (=C) of the assist capacitive element C1, in the second half period $TP_{W2}$ of the period $TP_W$ of a write operation. When the number of rows falls within the range of $N_{14}+1$ to $N_{15}$, two activation control signals RN[1] and RN[2] are selectively set to the active level. In this case, the assist capacitive elements C1 and C3 contribute to the assist operation by selection, to redistribute the electric charges in accordance with the ratio between the parasitic capacitance value of a bit line BL or BLB and the combined capacitance value ($C_1+C_3=5C$) of the assist capacitive elements C1 and C3, in the second half period $TP_{W2}$ of the period $TP_W$ of a write operation. When the number of rows falls within the range of $N_{19}+1$ to Nmax, four activation control signals RN[0] to RN[3] are set to the active level. In this case, the four assist capacitive elements C1 to C4 contribute to the assist operation, to redistribute the electric charges in accordance with the ratio between the parasitic capacitance value of a bit line BL or BLB and the combined capacitance value ($C_1+C_2+C_3+C_4=10C$) of the four assist capacitive elements C1 to C4, in the second half period $TP_{W2}$ of the period $TP_W$ of a write operation.

As described above, this embodiment configures the semiconductor memory device 1 to be adjustable in the ratio between the parasitic capacitance value of each bit line BL or BLB and the capacitance value of the assist circuit 8. For example, at the time of manufacturing or the like of the semiconductor memory device 1, the combined capacitance value of assist capacitive elements to be activated among the plurality of assist capacitive elements C1 to C4 is changed. This change is performed for the semiconductor memory device 1 to have a ratio estimated at the time of design to attain the write assist level $V_{WAST}$, for the ratio between the parasitic capacitance value of a bit line BL or BLB and the capacitance value of the assist circuit 8. Consequently, the write assist level $V_{WAST}$ may be made to fall within its appropriate range, and it is possible to reduce erroneous operations of the semiconductor memory device 1 and to improve the reliability of the device in the semiconductor memory device 1.

Second Embodiment

An explanation will be given of a semiconductor memory device 101 according to a second embodiment. Hereinafter, an explanation will be given by mainly focusing on part different from the first embodiment.

In the first embodiment, the ratio between the parasitic capacitance value of a bit line and the capacitance value of the assist circuit is adjusted by changing the combined capacitance value of capacitive elements to be activated in the assist circuit. In the second embodiment, the ratio between the parasitic capacitance value of bit lines and the capacitance value of the assist circuit is adjusted by changing the number of bit lines to be connected to each assist circuit.

Specifically, at the time of design of the semiconductor memory device 101, the ratio between the parasitic capacitance value of bit lines and the capacitance value of an assist circuit 108 is set to be adjustable by changing the number of columns to be connected to the assist circuit. The values of the parasitic capacitances $C_{BL}$ and $C_{BLB}$ of the bit lines can vary depending on the number of rows (the number of word lines WL) of the bit cell array 2. In the semiconductor memory device 101, for the ratio between the parasitic capacitance value of bit lines BL or BLB and the capacitance value of the assist circuit 108, the number of rows may be used to estimate a ratio that makes the write assist level $V_{WAST}$ fall within its appropriate range. When manufacturing the semiconductor memory device 101, the number of columns to be connected to one assist circuit is changed to obtain the ratio estimated at the time of design. For example, some assist circuits among a plurality of assist circuits corresponding to a plurality of columns are activated and connected to the plurality of columns, so that the number of columns connected to each assist circuit is changed to obtain the ratio estimated at the time of design. Consequently, in the semiconductor memory device 101 thus manufactured, the write assist level $V_{WAST}$ can fall within its appropriate range in a write operation. As a result, it is possible to reduce erroneous operations of the semiconductor memory device 101 and to improve the reliability of the device.

Figure 6:
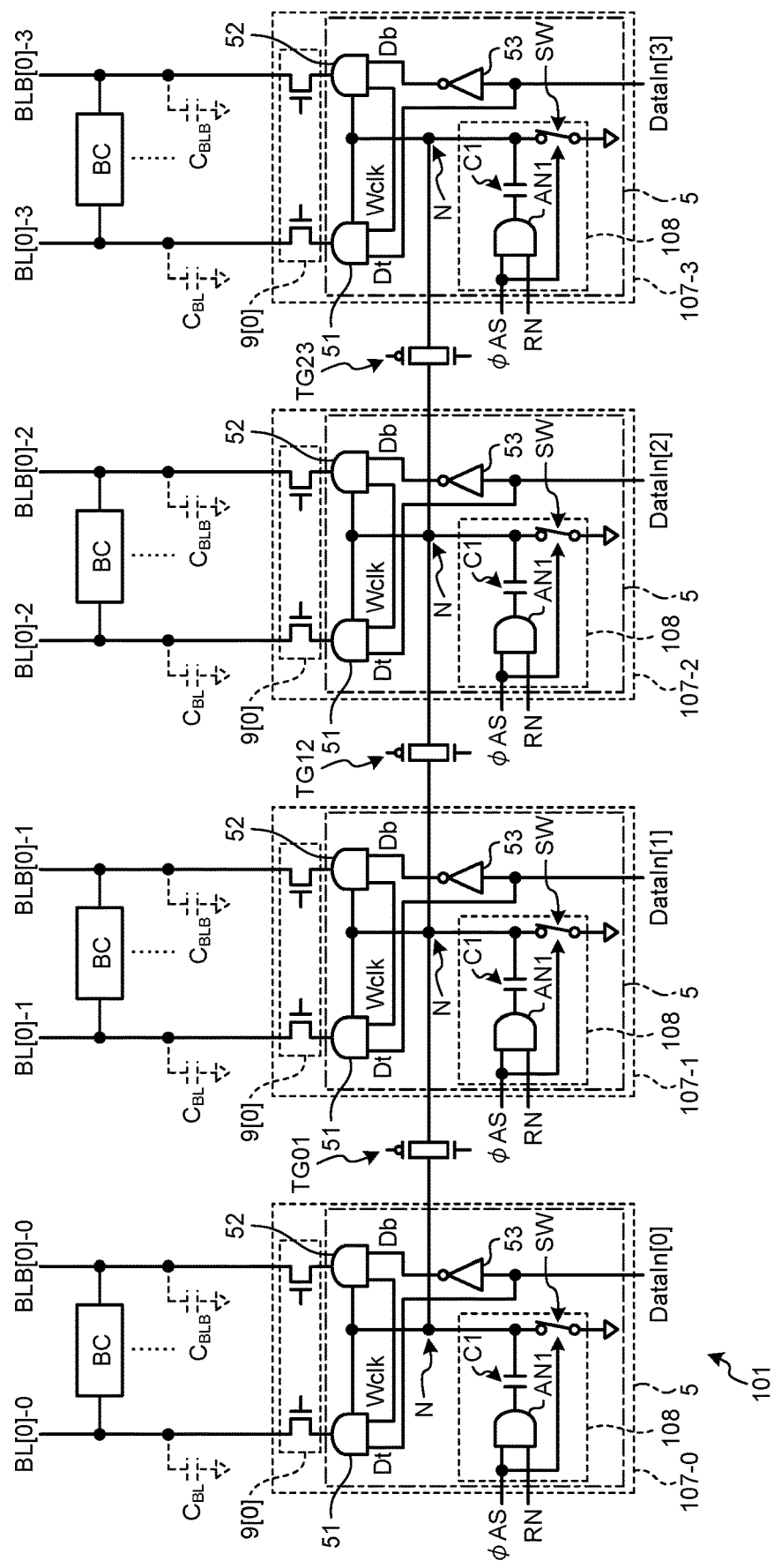
FIG. 6 is a diagram illustrating a configuration of a semiconductor memory device according to a second embodiment.

More specifically, as illustrated in FIG. 6, the semiconductor memory device 101 includes a plurality of transfer gates TG01, TG12, and TG23 between a plurality of IO circuits 107-0 to 107-3. FIG. 6 is a diagram illustrating a configuration of the semiconductor memory device 101 according to the second embodiment, and shows a configuration of part of a bit cell array 2 and part of a peripheral circuit in the semiconductor memory device 101. FIG. 6 illustrates a configuration provided with four IO circuits 107-0 to 107-3. FIG. 6 omits illustration of the column selector 9[1] and the column connected thereto at each of the IO circuits 107-0 to 107-3.

The write amplifier 5 of each of the IO circuits 107-0 to 107-3 includes the assist circuit 108 in place of the assist circuit 8 (see FIG. 4). The assist circuit 108 includes a single AND gate AN1 and a single assist capacitive element C1 in place of the plurality of AND gates AN1 to AN4 and the plurality of assist capacitive elements C1 to C4 (see FIG. 4).

The transfer gate TG01 is electrically connected between the IO circuit 107-0 and the IO circuit 107-1. The transfer gate TG01 is electrically connected at one end to a node N between the amplifiers 51 and 52 and the assist circuit 108 in the IO circuit 107-0, and is electrically connected at the other end to a node N between the amplifiers 51 and 52 and the assist circuit 108 in the IO circuit 107-1. The transfer gate TG01 electrically connects the node N of the IO circuit 107-0 to the node N of the IO circuit 107-1 when an active level control signal is supplied, and electrically disconnects the node N of the IO circuit 107-0 from the node N of the IO circuit 107-1 when a non-active level control signal is supplied.

The transfer gate TG12 is electrically connected between the IO circuit 107-1 and the IO circuit 107-2. The transfer gate TG12 is electrically connected at one end to the node N between the amplifiers 51 and 52 and the assist circuit 108 in the IO circuit 107-1, and is electrically connected at the other end to a node N between the amplifiers 51 and 52 and the assist circuit 108 in the IO circuit 107-2. The transfer gate TG12 electrically connects the node N of the IO circuit 107-1 to the node N of the IO circuit 107-2 when the active level control signal is supplied, and electrically disconnects the node N of the IO circuit 107-1 from the node N of the IO circuit 107-2 when the non-active level control signal is supplied.

The transfer gate TG23 is electrically connected between the IO circuit 107-2 and the IO circuit 107-3. The transfer gate TG23 is electrically connected at one end to the node N between the amplifiers 51 and 52 and the assist circuit 108 in the IO circuit 107-2, and is electrically connected at the other end to a node N between the amplifiers 51 and 52 and the assist circuit 108 in the IO circuit 107-3. The transfer gate TG23 electrically connects the node N of the IO circuit 107-2 to the node N of the IO circuit 107-3 when the active level control signal is supplied, and electrically disconnects the node N of the IO circuit 107-2 from the node N of the IO circuit 107-3 when the non-active level control signal is supplied.

It should be noted that, although FIGS. 4 and 5 omit illustration of an inverter 53 in each IO circuit 107, FIG. 6 illustrates the inverter 53 for confirmation. Specifically, the data DataIn input to the write amplifier 5 is made input to the amplifier 51 as the data Dt and is also made logically inverted by the inverter 53 and input to the amplifier 52 as the data Db. Consequently, the data Dt and Db become data complementary to each other.

The semiconductor memory device 101 keeps the assist signal φAS at the active level $V_{AST}$ in the first half period $TP_{W1}$ of the period $TP_W$ of a write operation illustrated in FIG. 3, so that the semiconductor memory device 101 turns on each switch SW, and accumulates electric charges in the assist capacitive element of each assist circuit 108 activated among the plurality of assist circuits 108. At this time, positive electric charges are accumulated at one end of the assist capacitive element of the activated assist circuit 108, and negative electric charges are accumulated at the other end. The semiconductor memory device 101 keeps the assist signal φAS at the non-active level $V_{UAST}$ in the second half period $TP_{W2}$ of the period $TP_W$ of a write operation, so that the semiconductor memory device 101 keeps each switch SW in a turn-off state, and redistributes the electric charges accumulated in the assist capacitive element of each activated assist circuit 108 in accordance with the ratio between the parasitic capacitance value of bit lines BL or BLB and the capacitance value of the assist circuit 108. At this time, part of the negative electric charges accumulated at the other end of the assist capacitive element of the activated assist circuit 108 are supplied to the bit lines BL or BLB in accordance with the ratio between the parasitic capacitance value of the bit lines BL or BLB and the capacitance value of the assist circuit 108. Consequently, the semiconductor memory device 101 controls the level of the bit lines BL or BLB to be at the write assist level $V_{WAST}$, which is lower than the selected level $V_{BSL}$, by using the assist circuits 108.

In order to control the write assist level $V_{WAST}$ to an appropriate level, the semiconductor memory device 101 may be adjusted in the ratio between the parasitic capacitance value of the bit lines and the capacitance value of the assist circuit by changing the number of bit lines to be connected to the assist circuit, at the time of manufacturing or the like. Accordingly, the semiconductor memory device 101 is set by changing the number of columns to be connected to the assist capacitive element of each assist circuit 108 to be activated among the plurality of assist circuits 108, so as to obtain a ratio estimated at the time of design for the ratio between the parasitic capacitance value of the bit lines BL or BLB and the capacitance value of the assist circuit 108.

Here, the ratio estimated at the time of design may be further checked in consideration of the influence of the capacitance value of the assist capacitive element of each deactivated assist circuit 108 among the plurality of assist circuits 108. Specifically, in a strict sense, electric charges accumulated in the assist capacitive element of each activated assist circuit 108 are redistributed in accordance with the ratios between the parasitic capacitance values of bit lines BL or BLB, the capacitance values of deactivated assist circuits 108, and the capacitance values of activated assist circuits 108. Accordingly, in consideration of the influence of the capacitance value of the assist capacitive element of a deactivated assist circuit 108, a ratio estimated at the time of design for the ratio between the parasitic capacitance value of bit lines BL or BLB and the capacitance value of each assist circuit 108 may be finely adjusted and used.

Figure 7A:
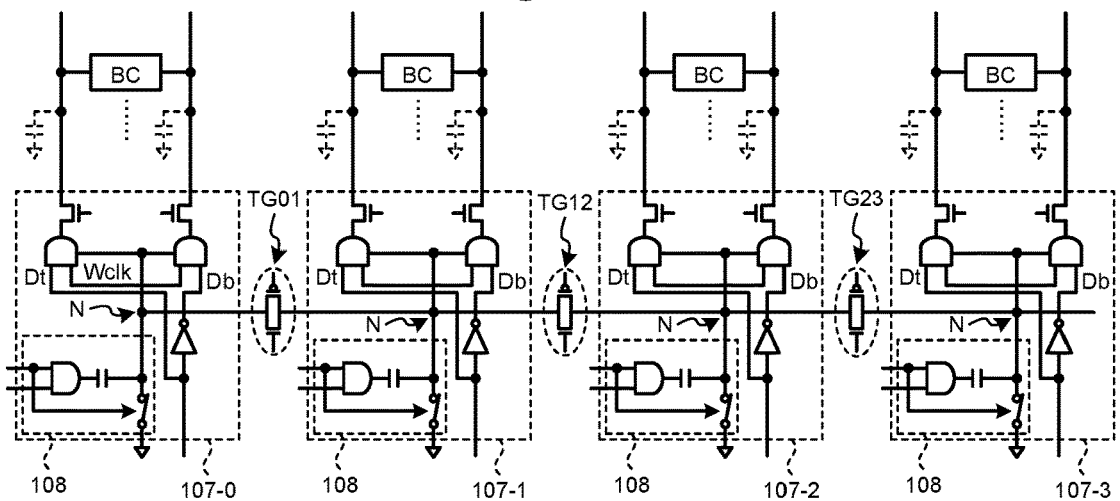
FIGS. 7A to 7C are diagrams illustrating an operation of the semiconductor memory device according to the second embodiment.
Figure 7B:
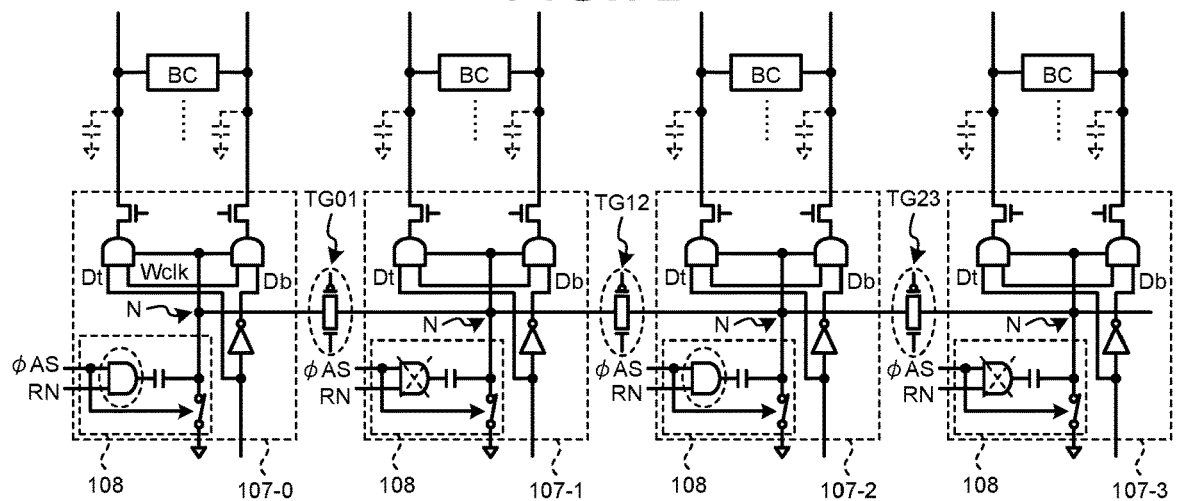
Figure 7C:
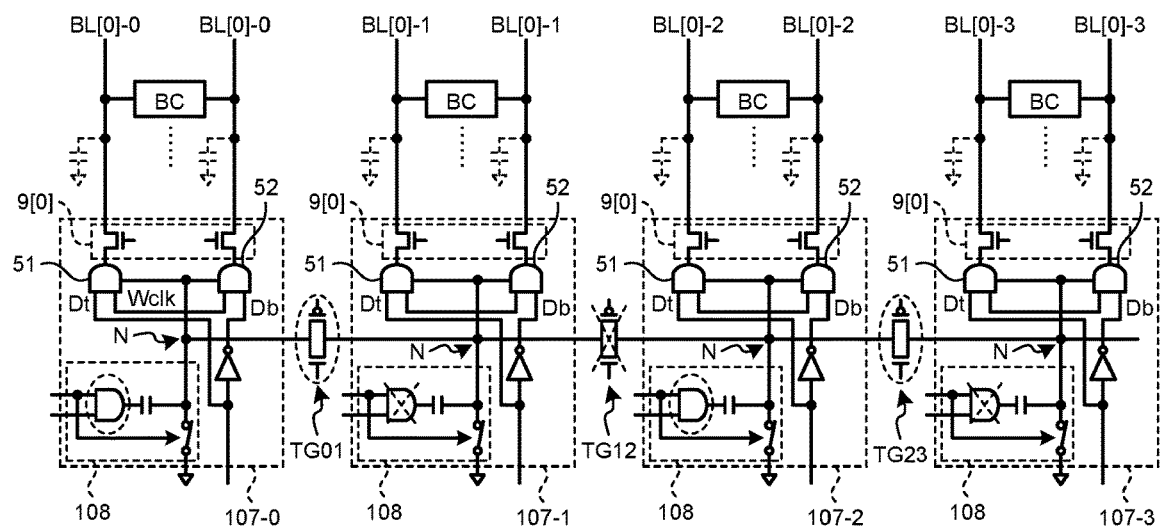

For example, in order to control the write assist level $V_{WAST}$ to an appropriate level, when it is appropriate to connect two columns to one assist circuit in accordance with the number of rows, the semiconductor memory device 101 is operated as illustrated in FIGS. 7A to 7C in the first half period $TP_{W1}$ of the period $TP_W$ of a write operation.

As illustrated in FIG. 7A, the semiconductor memory device 101 supplies the active level control signal to each of the transfer gate TG01, the transfer gate TG12, and the transfer gate TG23. Consequently, the node N of the IO circuit 107-0, the node N of the IO circuit 107-1, the node N of the IO circuit 107-2, and the node N of the IO circuit 107-3 are electrically connected to each other.

As illustrated in FIG. 7B, the semiconductor memory device 101 supplies the activation control signal RN at the active level to each of the AND gate AN1 of the assist circuit 108 of the IO circuit 107-0 and the AND gate AN1 of the assist circuit 108 of the IO circuit 107-2. Further, the semiconductor memory device 101 supplies the activation control signal RN at the non-active level to each of the AND gate AN1 of the assist circuit 108 of the IO circuit 107-1 and the AND gate AN1 of the assist circuit 108 of the IO circuit 107-3. Consequently, the assist circuits 108 of the IO circuits 107-0 and 107-2 are activated, and assist circuits 108 of the IO circuits 107-1 and 107-3 are deactivated. At this time, a state is maintained in which the active level control signal is supplied to each of the transfer gates TG01 to TG23.

As illustrated in FIG. 7C, while keeping the supply of the active level control signal to each of the transfer gate TG01 and the transfer gate TG23, the semiconductor memory device 101 supplies the non-active level control signal to the transfer gate TG12. Consequently, while a state is maintained in which the node N of the IO circuit 107-0 and the node N of the IO circuit 107-1 are electrically connected to each other and the node N of the IO circuit 107-2 and the node N of the IO circuit 107-3 are electrically connected to each other, the node N of the IO circuit 107-1 and the node N of the IO circuit 107-2 are electrically disconnected off from each other.

Consequently, two columns composed of a column including bit lines BL[0]-0 and BLB[0]-0 and a column including bit lines BL[0]-1 and BLB[0]-1 are connected to the assist circuit 108 of the IO circuit 107-0 through the amplifiers 51 and 52 and the column selectors 9[0] of the IO circuits 107-0 and 107-1. Similarly, two columns composed of a column including bit lines BL[0]-2 and BLB[0]-2 and a column including bit lines BL[0]-3 and BLB[0]-3 are connected to the assist circuit 108 of the IO circuit 107-2 through the amplifiers 51 and 52 and the column selectors 9[0] of the IO circuits 107-2 and 107-3. As a result, in the second half period $TP_{W2}$ of the period $TP_W$ of a write operation, the electric charges are redistributed in accordance with the ratio between the parasitic capacitance value of the bit lines BL or BLB of the two columns and the capacitance value of one assist capacitive element C1.

Figure 8A:
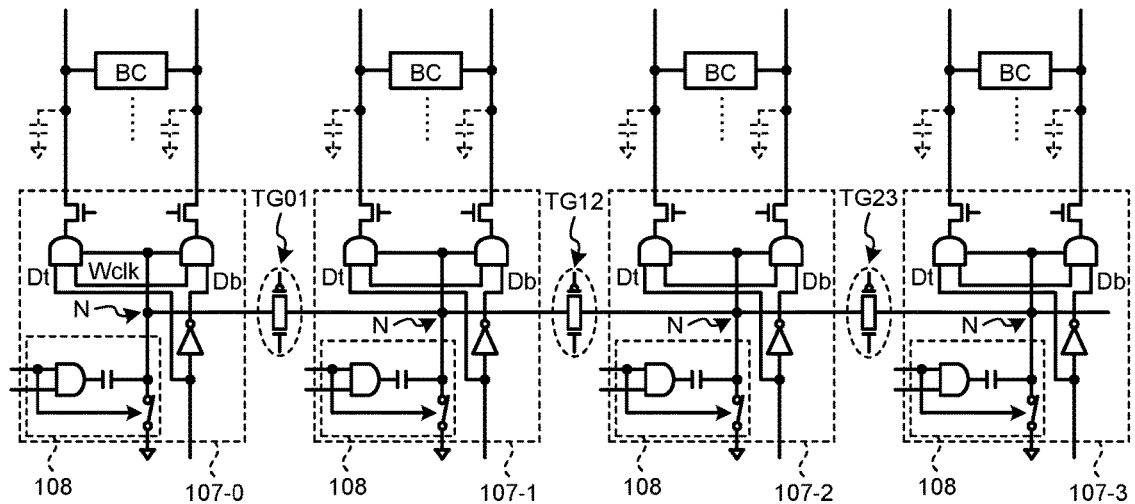
FIGS. 8A and 8B are diagrams illustrating an operation of the semiconductor memory device according to the second embodiment.
Figure 8B:
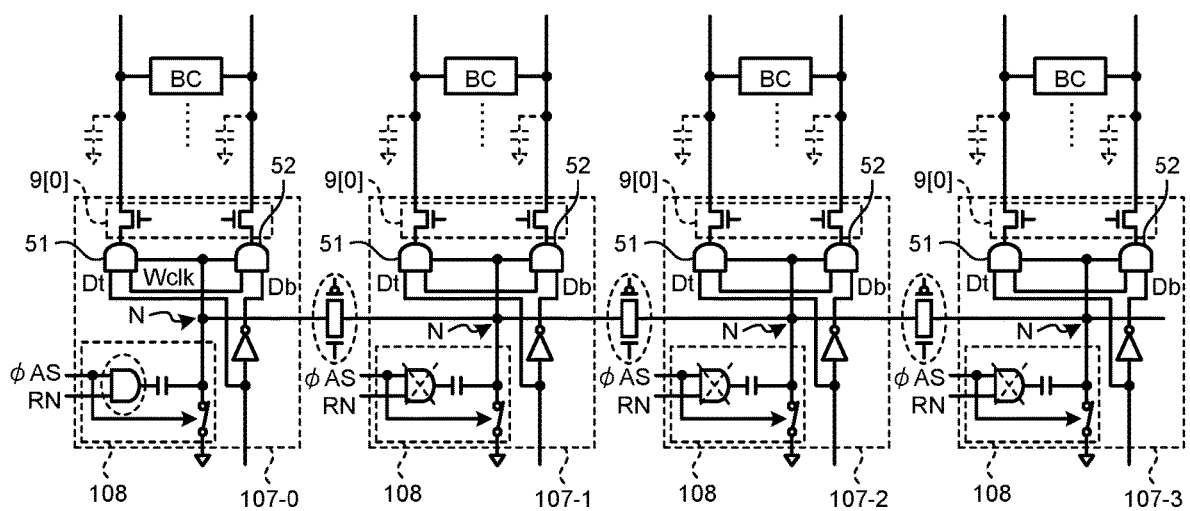

Alternatively, in order to control the write assist level $V_{WAST}$ to an appropriate level, when it is appropriate to connect four columns to one assist circuit in accordance with the number of rows, the semiconductor memory device 101 is operated as illustrated in FIGS. 8A and 8B in the first half period $TP_{W1}$ of the period $TP_W$ of a write operation.

As illustrated in FIG. 8A, the semiconductor memory device 101 supplies the active level control signal to each of the transfer gate TG01, the transfer gate TG12, and the transfer gate TG23. Consequently, the node N of the IO circuit 107-0, the node N of the IO circuit 107-1, the node N of the IO circuit 107-2, and the node N of the IO circuit 107-3 are electrically connected to each other.

As illustrated in FIG. 8B, the semiconductor memory device 101 supplies the activation control signal RN at the active level to the AND gate AN1 of the assist circuit 108 of the IO circuit 107-0. Further, the semiconductor memory device 101 supplies the activation control signal RN at the non-active level to each of the AND gate AN1 of the assist circuit 108 of the IO circuit 107-1, the AND gate AN1 of the assist circuit 108 of the IO circuit 107-2, and the AND gate AN1 of the assist circuit 108 of the IO circuit 107-3. Consequently, the assist circuit 108 of the IO circuit 107-0 is activated, and the assist circuits 108 of the IO circuits 107-1, 107-2, and 107-3 are deactivated. At this time, a state is maintained in which the active level control signal is supplied to each of the transfer gates TG01 to TG23.

Consequently, four columns composed of a column including bit lines BL[0]-0 and BLB[0]-0, a column including bit lines BL[0]-1 and BLB[0]-1, a column including bit lines BL[0]-2 and BLB[0]-2, and a column including bit lines BL[0]-3 and BLB[0]-3 are connected to the assist circuit 108 of the IO circuit 107-0 through the amplifiers 51 and 52 and the column selectors 9[0] of the IO circuits 107-0, 107-1, 107-2, and 107-3. As a result, in the second half period $TP_{W2}$ of the period $TP_W$ of a write operation, the electric charges are redistributed in accordance with the ratio between the parasitic capacitance value of the bit lines BL or BLB of the four columns and the capacitance value of one assist capacitive element C1.

As described above, the second embodiment configures the semiconductor memory device 101 such that the number of bit lines to be connected to one assist circuit may be changed. For example, the semiconductor memory device 101 is configured such that the number of columns to be connected to one assist circuit may be changed. Also with this arrangement, when manufacturing the semiconductor memory device 101, it is possible to adjust the ratio between the parasitic capacitance values of bit lines BL or BLB and the capacitance value of one assist circuit 108, which may make the write assist level $V_{WAST}$ fall within its appropriate range.

Here, the assist circuit 108 of each IO circuit 107 may be replaced with the assist circuit 8 configured as described in the first embodiment. In this case, it may be performed to change the combined capacitance value of capacitive elements to be activated in the assist circuit, together with a change in the number of bit lines to be connected the assist circuit, so as to adjust the ratio between the parasitic capacitance value of the bit lines and the capacitance value of the assist circuit to obtain a ratio estimated at the time of design.

Third Embodiment

An explanation will be given of a semiconductor memory device 201 according to a third embodiment. Hereinafter, an explanation will be given by mainly focusing on part different from the first embodiment and the second embodiment.

In the third embodiment, the semiconductor memory device 201 is configured with columns each formed of a plurality of banks, to address the use application of larger capacity as well. In other words, the semiconductor memory device 201 addresses demands of larger capacity not only by increasing the number of columns, but also by forming each column with a plurality of banks. Consequently, when the number of cells connectable per bit line has an upper limit, a bit cell array 202 may be provided with an area expanded not only in the column direction but also in the row direction, and thus can be easily laid out inside a chip while suppressing an increase in the chip area.

The semiconductor memory device 201 utilizes the column configuration of a plurality of banks to change the number of bit lines to be connected to the assist circuit. Specifically, the number of banks to be connected to the assist circuit for each column is changed to adjust the ratio between the parasitic capacitance value of bit lines BL or BLB and the capacitance value of the assist circuit 108.

Specifically, at the time of design of the semiconductor memory device 201, the ratio between the parasitic capacitance value of bit lines and the capacitance value of the assist circuit 108 is set to be adjustable by changing the number of banks to be connected to the assist circuit. The values of the parasitic capacitances $C_{BL}$ and $C_{BLB}$ of the bit lines may vary depending on the number of rows of the bit cell array 202. In the semiconductor memory device 201, for the ratio between the parasitic capacitance value of bit lines BL or BLB and the capacitance value of the assist circuit 108, the number of rows may be used to estimate a ratio that makes the write assist level $V_{WAST}$ fall within its appropriate range. When manufacturing the semiconductor memory device 201, the number of banks to be connected to the assist circuit is changed to obtain the ratio estimated at the time of its design. For example, the number of banks to be activated among a plurality of banks corresponding to each column is changed to obtain the ratio estimated at the time of its design. Consequently, in the semiconductor memory device 201 thus manufactured, the write assist level $V_{WAST}$ may fall within its appropriate range in a write operation. As a result, it is possible to reduce erroneous operations of the semiconductor memory device 201 and to improve the reliability of the device.

Figure 9:
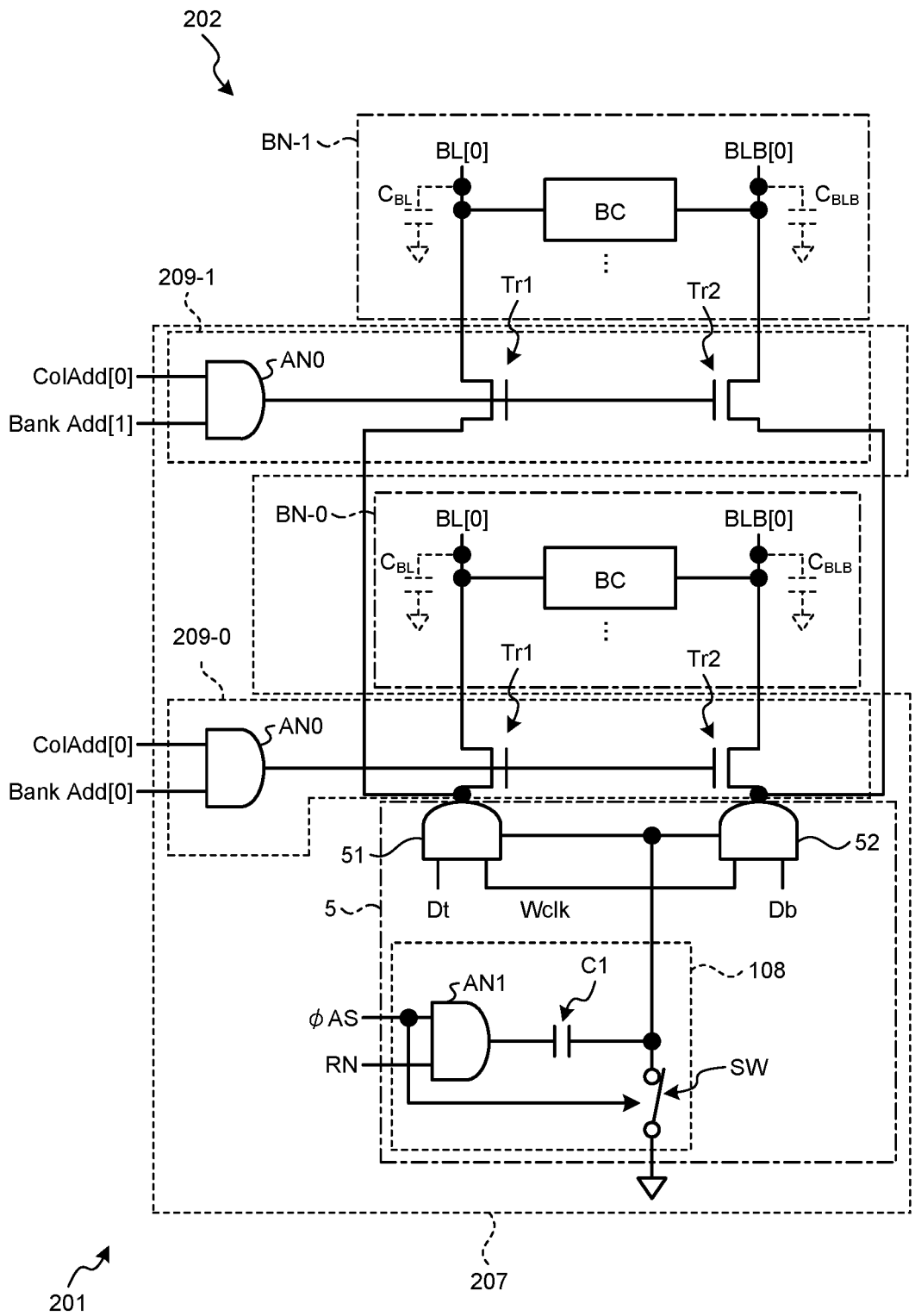
FIG. 9 is a diagram illustrating a configuration of a semiconductor memory device according to a third embodiment.

More specifically, as illustrated in FIG. 9, the semiconductor memory device 201 includes the bit cell array 202 and a plurality of IO circuits 207 in place of the bit cell array 2 and the plurality of IO circuits 7 (see FIG. 1). FIG. 9 is a diagram illustrating a configuration of the semiconductor memory device 201 according to the third embodiment. FIG. 9 illustrates the configuration of one column connected to one IO circuit 207, for the sake of simplicity of illustration.

In the bit cell array 202, each column includes a plurality of banks BN-0 and BN-1. Each bank BN has a structure corresponding to one column illustrated in FIG. 1, and includes a plurality of pairs of bit lines (BL[0], BLB[0]) and (BL[1], BLB[1]) and a plurality of bit cells BC corresponding to one column illustrated in FIG. 1.

Each IO circuit 207 includes a plurality of bank selectors 209 and an assist circuit 108 in place of the column selectors 9 and the assist circuit 8 (see FIG. 4). The assist circuit 108 is substantially the same as the assist circuit 108 according to the second embodiment.

The plurality of bank selectors 209-0 and 209-1 correspond to the plurality of banks BN-0 and BN-1. When the corresponding bank BN is selected, each bank selector 209 can connect the assist circuit 108 to the bit lines BL and BLB in this bank BN through the amplifiers 51 and 52.

Each bank selector 209 includes an AND gate AN0 in addition to the configuration substantially the same as that of the column selector 9.

The AND gate AN0 of the bank selector 209-0 receives a signal ColADD[0] at a first input node, and receives a signal BankADD[0] at a second input node. The AND gate AN0 is electrically connected at the output node to the gate of a transistor Tr1 and the gate of a transistor Tr2. The signal ColADD[0] is a signal for selecting a column. The signal BankADD[0] is a signal for selecting the bank BN-0.

When both of the signal ColADD[0] and the signal BankADD[0] become an active level, the bank selector 209-0 selects the bank BN-0, and connects the assist circuit 108 to the bit lines BL and BLB in this bank BN-0 through the amplifiers 51 and 52.

The AND gate AN0 of the bank selector 209-1 receives the signal ColADD[0] at a first input node, and receives a signal BankADD[1] at a second input node. The AND gate AN0 is electrically connected at the output node to the gate of a transistor Tr1 and the gate of a transistor Tr2. The signal BankADD[1] is a signal for selecting the bank BN-1.

When both of the signal ColADD[0] and the signal BankADD[1] become the active level, the bank selector 209-1 selects the bank BN-1, and connects the assist circuit 108 to the bit lines BL and BLB in this bank BN-1 through the amplifiers 51 and 52.

Figure 10A:
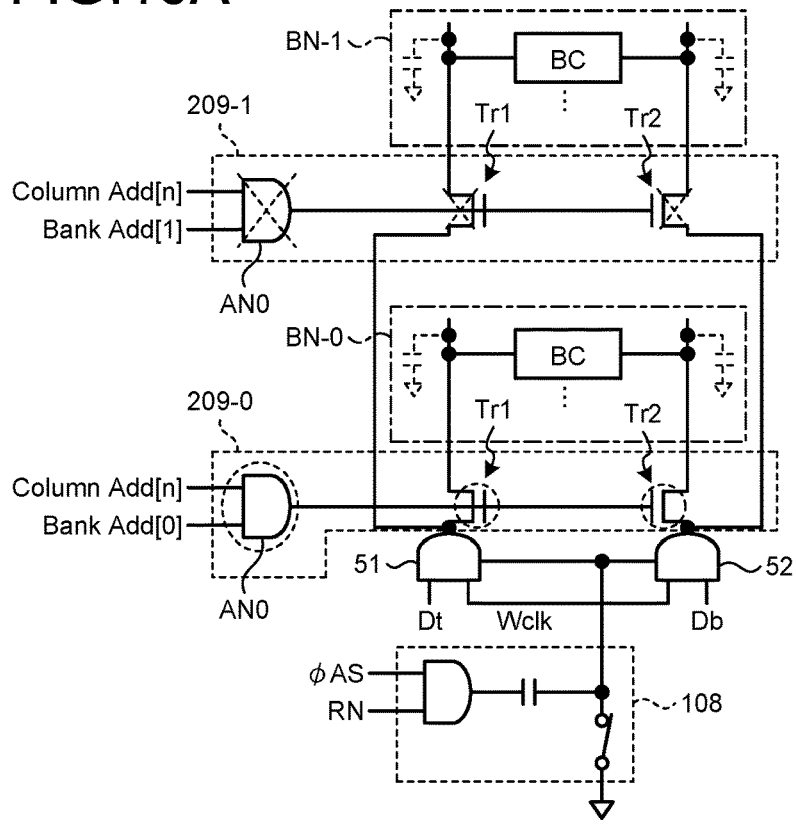
FIGS. 10A and 10B are diagrams illustrating an operation of the semiconductor memory device according to the third embodiment.

For example, in order to control the write assist level $V_{WAST}$ to an appropriate level, when it is appropriate to connect one bank to the assist circuit in accordance with the number of rows, the semiconductor memory device 201 is operated as illustrated in FIG. 10A in the first half period $TP_{W1}$ of the period $TP_W$ of a write operation.

The semiconductor memory device 201 supplies the signal ColADD[0] at the active level to the AND gate AN0 of each bank selector 209, supplies the BankADD[0] at the active level to the AND gate AN0 of the bank selector 209-0, and supplies the BankADD[1] at the non-active level to the AND gate AN0 of the bank selector 209-1. Consequently, the AND gate AN0 of the bank selector 209-0 is activated and turns on its transistors Tr1 and Tr2, and the AND gate AN0 of the bank selector 209-1 is deactivated and turns off its transistors Tr1 and Tr2. Thus, the bank selector 209-0 activates the bank BN-0 as a selected state, and the bank selector 209-1 deactivates the bank BN-1 as a non-selected state.

Consequently, the bit lines BL and BLB in one bank BN-0 are connected to the assist circuit 108 through the amplifiers 51 and 52. As a result, in the second half period $TP_{W2}$ of the period $TP_W$ of a write operation, the electric charges are redistributed in accordance with the ratio between the parasitic capacitance value of the bit line BL or BLB in this one bank and the capacitance value of one assist capacitive element C1.

Figure 10B:
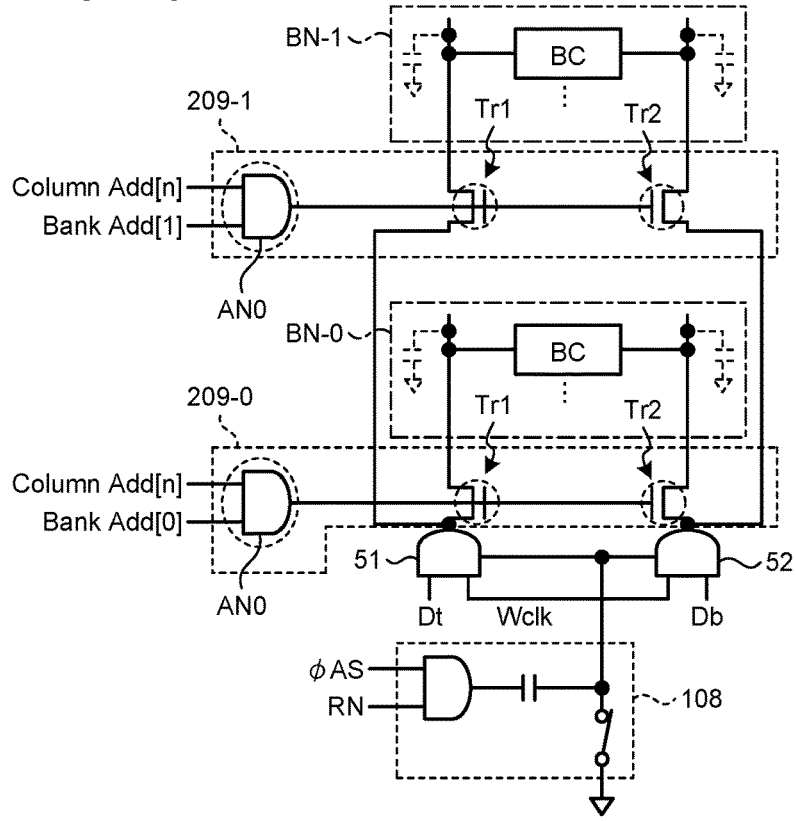

Alternatively, in order to control the write assist level $V_{WAST}$ to an appropriate level, when it is appropriate to connect two banks to the assist circuit in accordance with the number of rows, the semiconductor memory device 201 is operated as illustrated in FIG. 10B in the first half period $TP_{W1}$ of the period $TP_W$ of a write operation.

The semiconductor memory device 201 supplies the signal ColADD[0] at the active level to the AND gate AN0 of each bank selector 209, supplies the BankADD[0] at the active level to the AND gate AN0 of the bank selector 209-0, and supplies the BankADD[1] at the active level to the AND gate AN0 of the bank selector 209-1. Consequently, the AND gate AN0 of the bank selector 209-0 is activated and turns on its transistors Tr1 and Tr2, and the AND gate AN0 of the bank selector 209-1 is activated and turns on its transistors Tr1 and Tr2. Thus, the bank selector 209-0 activates the bank BN-0 as a selected state, and the bank selector 209-1 activates the bank BN-1 as a selected state.

Consequently, the bit lines BL and BLB in two banks BN-0 and BN-1 are connected to the assist circuit 108 through the amplifiers 51 and 52. As a result, in the second half period $TP_{W2}$ of the period $TP_W$ of a write operation, the electric charges are redistributed in accordance with the ratio between the parasitic capacitance value of the bit lines BL or BLB in these two banks and the capacitance value of one assist capacitive element C1.

Incidentally, in a case where a plurality of banks BN are connected to the assist circuit 108 through the amplifiers 51 and 52, a write operation to one bit cell BC is performed, while one bank BN including this selected bit cell BC is set as a selected bank BN among the plurality of banks BN, and the other banks BN are set as non-selected banks BN. The potential of each of the word lines connected to the respective bit cells BC of the non-selected banks BN is kept at the non-selected level $V_{WUSL}$. Consequently, it is possible to prevent erroneous writing in the respective bit cells BC of the non-selected banks BN.

As described above, the third embodiment configures the semiconductor memory device 201 such that the number of banks to be connected to the assist circuit may be changed. Also with this arrangement, when manufacturing the semiconductor memory device 201, it is possible to adjust the ratio between the parasitic capacitance value of bit lines BL or BLB and the capacitance value of the assist circuit 108, which may make the write assist level $V_{WAST}$ fall within its appropriate range.

Here, the assist circuit 108 of each IO circuit 207 may be replaced with the assist circuit 8 configured as described in the first embodiment. In this case, it may be performed to change the combined capacitance value of capacitive elements to be activated in the assist circuit, together with a change in the number of banks to be connected the assist circuit, which may adjust the ratio between the parasitic capacitance value of the bit lines and the capacitance value of the assist circuit to obtain a ratio estimated at the time of its design.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:

a plurality of bit cells;

a plurality of pairs of bit lines corresponding to a plurality of columns, each bit line being electrically connected to the bit cell;

a plurality of assist circuits corresponding to a plurality of columns, each assist circuit being configured to be connected to the bit lines and including one or more capacitive elements;

a plurality of write amplifiers corresponding to a plurality of columns, each write amplifier electrically connected between corresponding one of the assist circuits and corresponding one pair of the pairs of bit lines; and a plurality of transfer gates each configured to connect nodes of adjacent columns to each other, each of the nodes being between corresponding one of the assist circuits and corresponding one of the write amplifiers, wherein a ratio between a parasitic capacitance value of each of the bit lines and a capacitance value of the assist circuit is adjustable by changing a number of activated transfer gates.

2. The semiconductor memory device according claim 1, wherein the semiconductor memory device adjusts a ratio between a parasitic capacitance value of the bit line and a capacitance value of the assist circuit to a ratio that makes a write assist level of the bit line given by the assist circuit fall within an appropriate range.

3. The semiconductor memory device according claim 1, wherein the assist circuit includes a plurality of capacitive elements, and the semiconductor memory device is adjustable in the ratio by changing a combined capacitance value of capacitive elements to be activated among the plurality of capacitive elements.

4. The semiconductor memory device according claim 3, wherein the semiconductor memory device is adjustable in the ratio by changing a number of capacitive elements to be activated among the plurality of capacitive elements.

5. The semiconductor memory device according claim 4, wherein the plurality of capacitive elements have capacitance values equivalent to each other, and the semiconductor memory device is adjustable in the ratio, in a number of stages that corresponds to a total number of the capacitive elements, by changing a number of capacitive elements to be activated among the plurality of capacitive elements.

6. The semiconductor memory device according claim 4, wherein the plurality of capacitive elements have capacitance values different from each other by a factor of two, and the semiconductor memory device is adjustable in the ratio, in a number of stages obtained by calculating two to the power of a total number of the capacitive elements, by changing a number of capacitive elements to be activated among the plurality of capacitive elements.

7. The semiconductor memory device according claim 1, wherein the semiconductor memory device changes the number of columns to be electrically connected to an assist circuit by activating assist circuits among the plurality of assist circuits and electrically connecting these assist circuits to the plurality of columns.

8. The semiconductor memory device according claim 7, wherein the assist circuit further includes a plurality of AND gates corresponding to the plurality of capacitive elements, and each of the plurality of AND gates is electrically connected at an output node to another end of a corresponding capacitive element.

9. The semiconductor memory device according claim 8, wherein each of the plurality of AND gates calculates a logical product of an assist signal commonly supplied and an activation control signal individually supplied.

10. The semiconductor memory device according claim 9, further comprising a plurality of word lines, each of which is electrically connected to a bit cell, wherein the assist signal is set to an active level in a period in which a write assist operation should be performed, and a number of activation control signals corresponding to a total number of the word lines are set to an active level, among a plurality of activation control signals to be supplied to the plurality of AND gates.

11. The semiconductor memory device according claim 10, further including a switch configured to connect one end of each of the plurality of capacitive elements to a ground potential, wherein the switch is kept in a turn-off state in a period in which a write assist operation should be performed, and is kept in a turn-on state before the period.

12. The semiconductor memory device according claim 7, wherein the assist circuit further includes a switch configured to connect one end of each of the plurality of capacitive elements to a ground potential.

13. The semiconductor memory device according claim 9, wherein the assist circuit further includes a switch configured to connect one end of each of the plurality of capacitive elements to a ground potential, in accordance with the assist signal.

14. The semiconductor memory device according claim 1, comprising a plurality of pairs of bit lines, wherein the plurality of pairs of bit lines correspond to a plurality of banks in a same column, and the semiconductor memory device is adjustable in the ratio by changing a number of banks to be connected to the assist circuit.

15. The semiconductor memory device according claim 1, wherein the semiconductor memory device is adjustable in the ratio by changing a number of columns to be connected to an assist circuit to be activated among the plurality of assist circuits.

16. A semiconductor memory device comprising:

a bit cell;

a pair of bit lines electrically connected to the bit cell; and an assist circuit configured to be connected to the bit lines and including one or more capacitive elements, wherein a ratio between a parasitic capacitance value of each of the bit lines and a capacitance value of the assist circuit is adjustable, wherein the semiconductor memory device is adjustable in the ratio by changing a number of bit lines to be connected to the assist circuit among the plurality of pairs of bit lines, the plurality of pairs of bit lines correspond to a plurality of columns, the semiconductor memory device comprises a plurality of assist circuits corresponding to the plurality of columns, the semiconductor memory device is adjustable in the ratio by changing a number of columns to be connected to an assist circuit to be activated among the plurality of assist circuits, and the semiconductor memory device changes the number of columns to be connected to an assist circuit, by activating assist circuits among the plurality of assist circuits and connecting these assist circuits to the plurality of columns.

17. The semiconductor memory device according claim 16, further comprising:
- a plurality of write amplifiers corresponding to the plurality of columns and each electrically connected between corresponding one of the assist circuits and corresponding one pair of the pairs of bit lines; and
- a plurality of transfer gates each configured to connect nodes of adjacent columns to each other, each of the nodes being between corresponding one of the assist circuits and corresponding one of the write amplifiers.

18. The semiconductor memory device according claim 17, wherein
each of the assist circuits includes a capacitive element electrically connected at one end to corresponding one of the nodes.

19. The semiconductor memory device according claim 18, wherein
the semiconductor memory device changes the number in accordance with a number of transfer gates to be turned on among the plurality of transfer gates and whether the capacitive element is to be activated.

20. The semiconductor memory device according claim 16, wherein
the plurality of pairs of bit lines correspond to a plurality of banks in a same column, and
the semiconductor memory device is adjustable in the ratio by changing a number of banks to be connected to the assist circuit.

* * * * *